United States Patent
Jang

[11] Patent Number: 5,999,031
[45] Date of Patent: *Dec. 7, 1999

[54] SEMICONDUCTOR DEVICE WITH BUS LINE LOADING COMPENSATION CIRCUIT

[75] Inventor: Hyun-soon Jang, Seoul, Rep. of Korea

[73] Assignee: Samsung Electronics Co., Ltd., Kyungki-Do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/683,376

[22] Filed: Jul. 18, 1996

[30] Foreign Application Priority Data

Jul. 19, 1995 [KR] Rep. of Korea ............ 95-21212

[51] Int. Cl.[6] .................................................. H03H 11/26
[52] U.S. Cl. ....................... 327/288; 327/278; 327/285
[58] Field of Search ................... 327/108–112, 374–378, 327/382, 383, 389, 391, 434, 437, 165, 166, 227, 263, 264, 272, 278, 285, 288

[56] References Cited

U.S. PATENT DOCUMENTS

| 5,218,237 | 6/1993 | Mao .................................. 327/288 |
| 5,594,374 | 1/1997 | Oh ................................... 327/108 |
| 5,600,274 | 2/1997 | Houston ........................... 327/108 |
| 5,610,548 | 3/1997 | Masleid ........................... 327/108 |
| 5,767,719 | 6/1998 | Furuchi et al. ................. 327/288 |

FOREIGN PATENT DOCUMENTS

| 63-54014 | 3/1988 | Japan ............................. 327/288 |
| 1-225221 | 9/1989 | Japan ............................. 327/288 |

*Primary Examiner*—Kenneth B. Wells
*Attorney, Agent, or Firm*—Pillsbury Madison & Sutro LLP

[57] ABSTRACT

A semiconductor device is provided having an input driver and an output receiver connected by a bus line, the bus line including pulse generating and driver circuitry responsive to threshold levels of voltage change so as to perform high speed switching which compensates for the load of the bus line.

3 Claims, 2 Drawing Sheets

SEMICONDUCTOR DEVICE WITH BUS LINE LOADING COMPENSATION CIRCUIT

BACKGROUND OF THE INVENTION

The present invention relates to a semiconductor device, and more particularly, to a semiconductor device with a bus line loading compensating circuit for improving transmission characteristics.

As semiconductor devices become more highly integrated, the size of the devices composing the chip become smaller. Nevertheless, as the chip size of semiconductor devices increases the length of transmission lines for the semiconductor device, e.g., input-output lines or data lines, become longer. Also, the number of circuits and devices connected to the transmission lines, e.g., bus lines, increases as well. Therefore, loading of the bus line driving circuits and devices also increases.

In addition, it is required that the semiconductor devices be operated at high speeds. Therefore, it is essential that there be a reduction in delay time on the bus lines for highly integrated and high-speed operated semiconductor devices. As a result, the reply characteristics and transmission characteristics of bus lines connecting the devices and circuits should be improved.

FIG. 1 is a circuit diagram showing a bus line connection according to the prior art.

As shown in FIG. 1, transmission signal IN is input to the input terminal of inverter 101 in input driver 100. Output terminal NA of inverter 101 is connected to one terminal of bus line 200, and the other terminal of bus line 200 is connected to input terminal NB of inverter 301 in receiver 300. Also, the output terminal of inverter 301 in receiver 300 transmits output signal OUT. The elements 201, 202, 203 and 204 are resistance components of the loading of the bus line 200, and the elements 205, 206, 207, 208 and 209 are capacitance components of the loading of the bus line 200.

That is, transmission signal IN is transmitted to inverter 101 in input input driver 100, and then the output signal from input input driver 100 is transmitted to inverter 301 in receiver 300 via the bus line. The bus line positioned between input input driver 100 and receiver 300 and the loading capacity thereof determines a transmission characteristic of transmission signal IN. The loading can be divided into resistance component R and capacitance component C which determine the transmission characteristics of speed and efficiency. As known by those skilled in the art, RC is a time constant.

Decreasing bus line loading for reducing the delay time of a transmission signal is advantageous in high speed operation. That is, a small RC constant is advantageous to high speed transmission, and thus many efforts to reduce the RC time constant have been undertaken. A method for reducing capacitive loading by adequately adjusting the space between bus lines, a method for increasing driver size, a method for minimizing the length of the bus lines by changing the chip architecture and so on are under study, but those methods have not yet been satisfactory.

That is, when the space between bus lines becomes too wide, chip size increases, which is disadvantageous in large-scale integration. When driver size becomes too large, that is, the area occupied by the driver becomes wide, chip efficiency deteriorates, power consumption increases, and serious noise due to peak current results. Moreover, because chip architecture substantially depends on the entire arrangement of logic circuits and bonding pads and core construction rather than bus line length, the method of changing the chip architecture for reducing the delay time of a bus line has limits.

SUMMARY OF THE INVENTION

With a view to reducing or removing the above problems, an object of the present invention is to provide a semiconductor device with a loading compensating circuit so that the transmission characteristics of a bus line can be improved and thus a signal can be transmitted at high speed.

To accomplish the above object, there is provided a semiconductor device comprising:

an input driver;

receiving means; and loading compensating means, inserted in a predetermined position of a bus line, connecting the input driver means and the receiving means to load compensating means including, pulse generating means for generating a predetermined pulse signal and driving means for producing the output signal of the driving means in response to the pulse signal.

BRIEF DESCRIPTION OF THE DRAWINGS

The above object and advantage of the present invention will become more apparent by describing in detail a preferred embodiment thereof with reference to the attached drawings in which.

DETAILED DESCRIPTION OF THE INVENTION

A preferred embodiment of a semiconductor device having a loading compensating circuit according to the present invention will be described below. In FIG. 2, the devices and circuits identical to those in FIG. 1 will be labeled with the same reference designations as in FIG. 1.

FIG. 2 shows a preferred embodiment according to the present invention wherein a bus line connection with a loading compensating circuit is provided.

Figure 1:
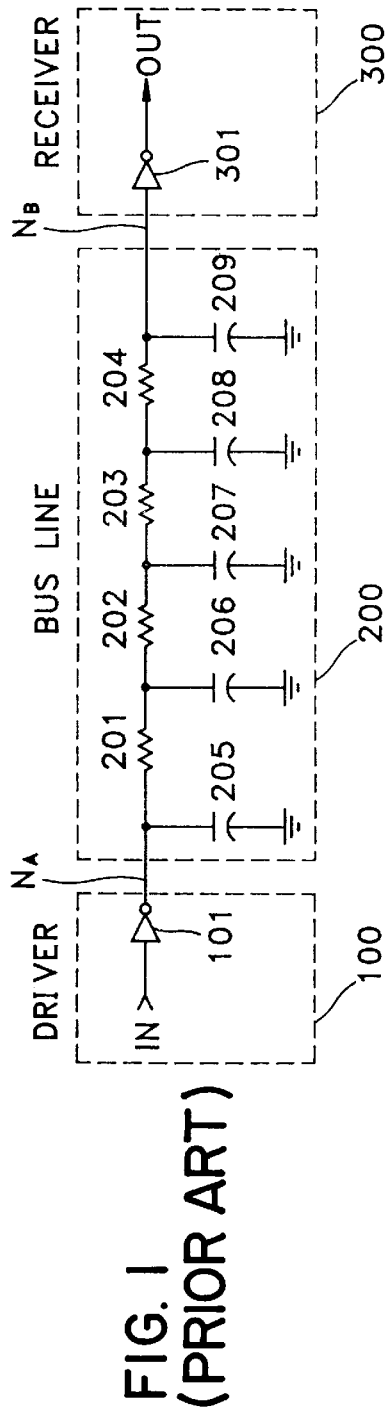
FIG. 1 is a circuit diagram showing a bus line connection according to the prior art.
Figure 2:
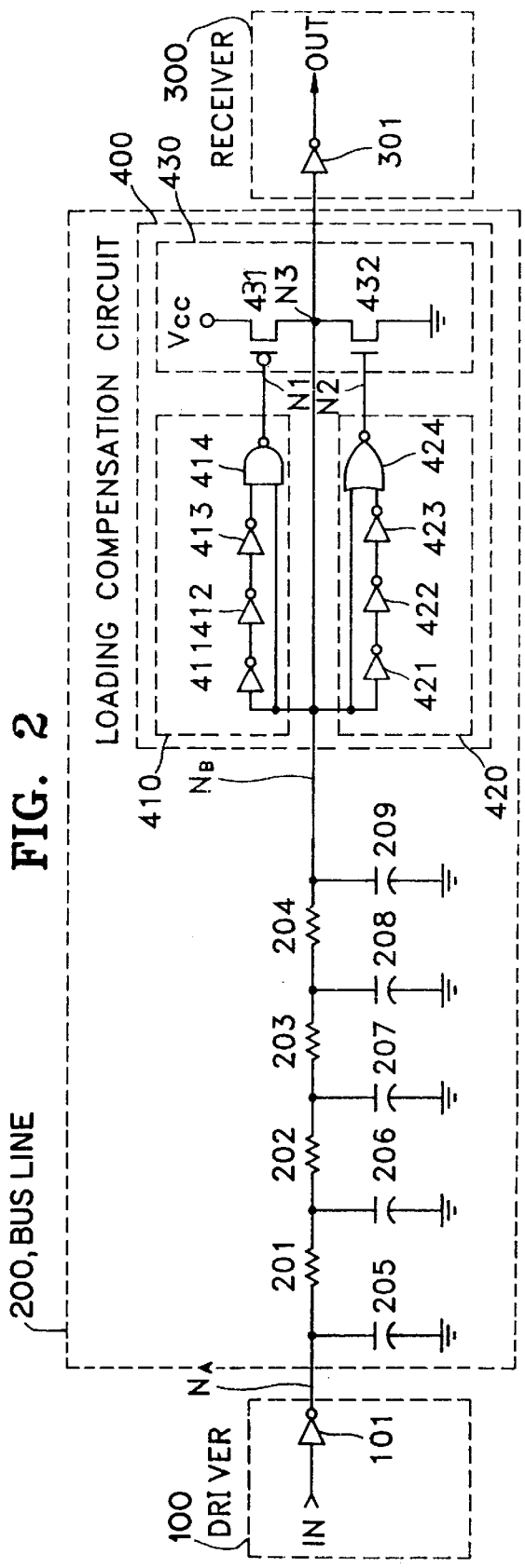
FIG. 2 is a circuit diagram showing a bus line connection with a loading compensating circuit according to the present invention.

Excepting for loading compensating circuit 400 between bus line 200 and receiver 300, the configuration in FIG. 2 is the same as that in FIG. 1.

As shown in FIG. 2, loading compensating circuit 400 is constituted by first pulse generating circuit 410, second pulse generating circuit 420, and driving device 430. First pulse generating circuit 410 is constituted by a delaying device composed of serial-connected inverters 411, 412, and 413, and NAND gate 414 for gating an output signal of the delaying device and an output of the bus line. Second pulse generating circuit 420 is constituted of a delaying device composed of serial-connected inverters 421, 422, and 423 and NOR gate 424 for gating an output of the delaying device and an output of the bus line. Also, output terminal N1 of NAND gate 414 and output terminal N2 of NOR gate 424 are connected to the gates of PMOS transistor 431 and NMOS transistor 432, respectively, which together constitute driving device 430. The source of PMOS transistor 431 is connected to source voltage terminal Vcc and the drain thereof is connected to the drain of NMOS transistor 432. The source of NMOS transistor 432 is connected to ground terminal. Moreover, connection node N3 between PMOS transistor 431 and NMOS transistor 432 is connected to the input terminal of inverter 301 constituting receiver 300. All other devices are the same as that shown in FIG. 1.

The operating characteristic of the bus line according to a preferred embodiment of the present invention, as shown in FIG. 2, will now be described.

When a voltage change corresponding to a threshold voltage occurs on node $N_B$ positioned on an output terminal of the bus line, the loading compensating circuit detects the change and drives PMOS transistor 431 or NMOS transistor 432 for a moment in order to compensate transmission loss due to the loading of bus line 200, and thus the transmission characteristics of the transmission signal can be improved. Such operation of the loading compensating circuit can be possible by adequately adjusting the trip point of NAND gate 414 and NOR gate 424, driving node N1 and node N2, respectively.

When transmission signal IN is changed from "low" to "high", second pulse generating circuit 420 generates a high level signal to activate the NMOS transistor 432, and therefore the discharging operation of a signal transmitted to node N3 is performed at high speed. Also, when transmission signal IN is changed from "high" to "low", first pulse generating circuit 410 generates a low level signal to activate PMOS transistor 431, and therefore power voltage Vcc is applied to node N3 at high speed. By such a series of processes, the transmission loss during transmission can be compensated for.

In other words, when transmission signal IN is changed from "high" to "low" or from "low" to "high", the loading compensating circuit starts to operate on the time of the node N3 potential reaching a predetermined value and minimizing the transmission loss.

Figure 3:
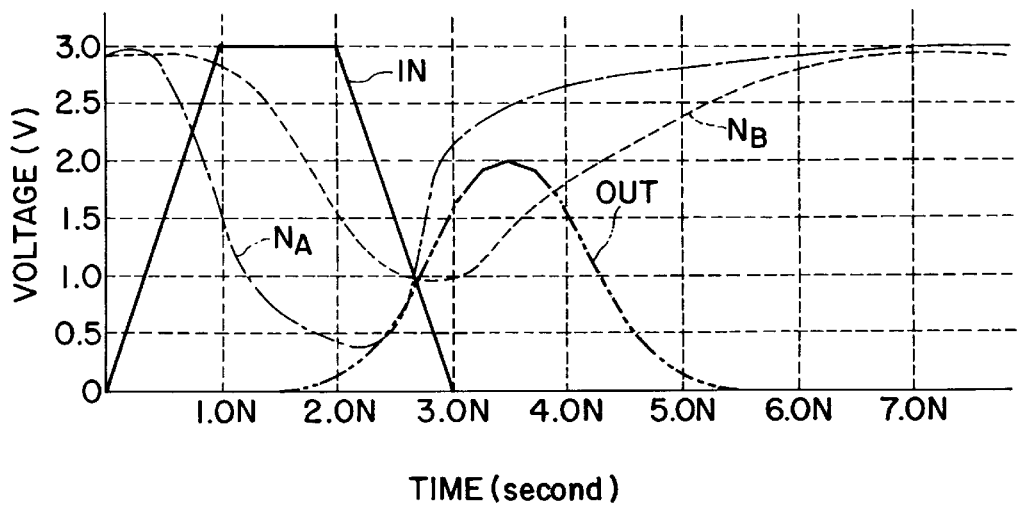
FIG. 3 shows a waveform diagram of a transmission signal according to the circuit of FIG. 1.
Figure 4:
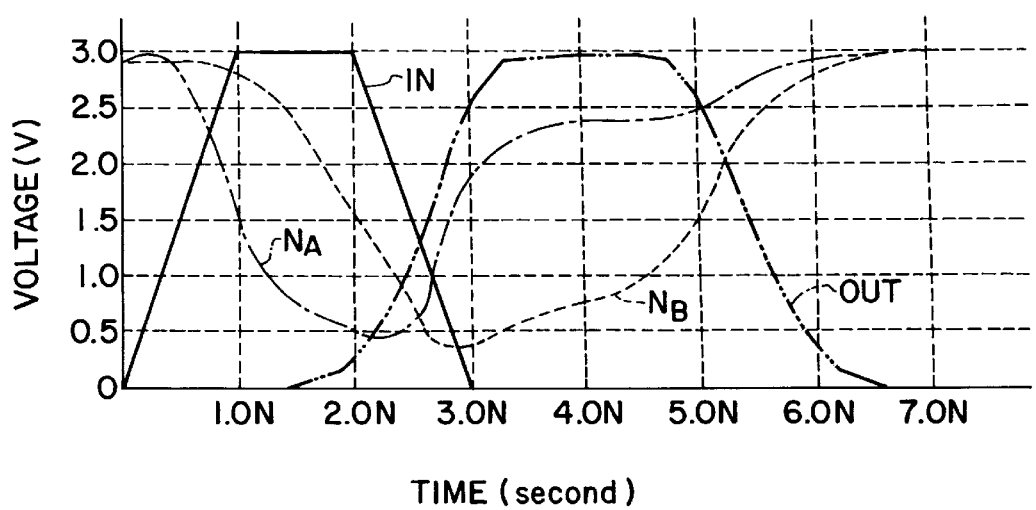
FIG. 4 shows a waveform diagram of a transmission signal according to the circuit of FIG. 2.

FIGS. 3 and 4 show waveform diagrams of the transmission signals according to the circuits of FIGS. 1 and 2, respectively.

According to a conventional bus line connecting method, when transmission signal IN is input in the form of a pulse as shown in FIG. 3, information on transmission signal IN cannot be sufficiently transmitted to bus line terminal node $N_B$. Consequently, because the information on transmission signal IN cannot be sufficiently transmitted to receiver 300, output signal OUT cannot be reproduced sufficiently. That is, the conventional bus line connecting method is not proper to a highly integrated and high frequency operated semiconductor device.

However, such a problem can be overcome by the present invention. That is, the loading compensating circuit positioned on the output terminal of the bus line detects and compensates a signal passing through the bus line, and thus a short pulse form of output signal OUT corresponding sufficiently to input transmission signal IN, as shown in FIG. 4, can be generated.

As described above, a semiconductor device with the loading compensation portion, according to the present invention, operates properly with respect to a highly integrated and high frequency operated semiconductor device, because the delay time due to the RC time constant of the bus line can be reduced. Consequently, the output signal waveform can reproduce the input transmission signal sufficiently, and thus the transmission characteristic becomes improved.

It will be clear to a person skilled in the art that many modifications to the embodiment described above are possible.

What is claimed is:

1. A semiconductor device comprising:

an input driver for outputting a first signal;

receiving means;

a bus line connected between said input driver and said receiving means for transmitting said first signal to said receiving means;

loading compensation means connected to said bus line, said loading compensation means including: a first pulse generating means for generating a first pulse signal in response to a signal transmitted through said bus line;

a first driving means for driving said bus line in response to said first pulse signal;

a second pulse generating means for generating a second pulse signal in response to the signal transmitted through said bus line; and a second driving means for driving said bus line in response to said second pulse signal.

2. A bus line loading compensation circuit for compensating a loading of a bus line comprising:

a first pulse generating circuit for generating a first pulse signal in response to a signal transmitted through said bus line;

a first driving means for driving said bus line in response to said first pulse signal;

a second pulse generating circuit for generating a second pulse signal in response to the signal transmitted through the bus line; and a second driving means for driving said bus line in response to said second pulse signal.

3. A bus line loading compensation circuit for a semiconductor device comprising:

a first pulse generating circuit including a first delaying device comprised of serially connected inverters and a NAND gate, one end of said serially connected inverters and one input of said NAND gate receiving an input signal, and another input of said NAND gate being connected to the opposite end of said serially connected inverters;

a second pulse generating circuit including a second delaying device comprised of serially connected inverters and a NOR gate, one end of said serially connected inverters and one input of said NOR gate receiving said input signal, and another input of said NOR gate being connected to the opposite end of said serially connected inverters of the second pulse generating circuit; and driving means including a PMOS transistor and an NMOS transistor, said PMOS transistor having a gate connected to an output of said NAND gate and said NMOS transistor having a gate connected to an output of said NOR circuit, said PMOS transistor having a source connected to a voltage source and a drain connected to a drain of said NMOS transistor, and said NMOS transistor having a source connected to ground.

\* \* \* \* \*